(12) United States Patent
Teowee et al.

(10) Patent No.: US 12,044,516 B2
(45) Date of Patent: Jul. 23, 2024

(54) INTEGRATED DETONATOR SENSORS

(71) Applicant: Austin Star Detonator Company, Cleveland, OH (US)

(72) Inventors: Gimtong Teowee, Westlake Village, CA (US); John David Rathbun, Hunting Valley, OH (US); Larry S. Howe, Norwalk, OH (US); Walter Jacob Harders, Rocky River, OH (US)

(73) Assignee: Austin Star Detonator Company, Cleveland, OH (US)

(*) Notice: Subject to any disclaimer, the term of this patent is extended or adjusted under 35 U.S.C. 154(b) by 104 days.

(21) Appl. No.: 17/797,807

(22) PCT Filed: Jan. 29, 2021

(86) PCT No.: PCT/US2021/015904
§ 371 (c)(1),
(2) Date: Aug. 5, 2022

(87) PCT Pub. No.: WO2021/178082
PCT Pub. Date: Sep. 10, 2021

(65) Prior Publication Data
US 2023/0072419 A1 Mar. 9, 2023

(51) Int. Cl.
*F42D 1/05* (2006.01)
*E21B 43/1185* (2006.01)
(Continued)

(52) U.S. Cl.
CPC ...... *F42C 19/0807* (2013.01); *E21B 43/1185* (2013.01); *E21B 47/07* (2020.05); *F42D 1/05* (2013.01)

(58) Field of Classification Search
CPC ........ F42D 1/05; F42D 1/045; E21B 43/1185; E21B 43/11857; F42C 11/02
See application file for complete search history.

(56) References Cited

U.S. PATENT DOCUMENTS 4,572,954 A 2/1986 Josephson et al.
4,757,463 A 7/1988 Ballou et al.
(Continued)

FOREIGN PATENT DOCUMENTS

JP 5634076 B2 8/2011
WO 2001092812 A1 12/2001
(Continued)

OTHER PUBLICATIONS

International Search Report and Written Opinion of International Application No. PCT/EP2021/015904 Dated Oct. 20, 2021, 7 pages.
(Continued)

*Primary Examiner* — Jonathan C Weber
(74) *Attorney, Agent, or Firm* — Lippes Mathias LLP

(57) ABSTRACT

A detonator includes a substrate, a controller mounted to the substrate, and a sensor coupled to the controller to measure a temperature, pressure, acceleration or other environmental parameter of the detonator. The controller is configured to transmit the measured environmental parameter from the detonator to a remote master controller, execute an action in response to a value of the measured environmental parameter, and/or prevent or modify at least one detonator function in response to the value of the measured environmental parameter.

18 Claims, 13 Drawing Sheets

(51) Int. Cl.
  *E21B 47/07* (2012.01)
  *F42C 19/08* (2006.01)

(56) References Cited

U.S. PATENT DOCUMENTS

| | | | |
|---|---|---|---|
| 4,796,206 A | 1/1989 | Boscove et al. | |
| 4,829,390 A | 5/1989 | Simon | |
| 4,869,171 A | 9/1989 | Abouav | |
| 5,117,756 A | 6/1992 | Goffin, II | |
| 5,369,579 A * | 11/1994 | Anderson | F42D 1/04 |
| | | | 175/4.54 |
| 5,406,889 A | 4/1995 | Letendre et al. | |
| 5,972,638 A | 10/1999 | Burlage et al. | |
| 6,003,809 A | 12/1999 | Honisgbaum | |
| 6,031,377 A | 2/2000 | Watkins | |
| 6,085,659 A | 7/2000 | Beukes et al. | |
| 6,273,187 B1 * | 8/2001 | Voisin, Jr. | E21B 37/00 |
| | | | 166/376 |
| 6,307,810 B1 | 10/2001 | Shany et al. | |
| 6,345,784 B1 | 2/2002 | Shnaps | |
| 6,474,592 B1 | 11/2002 | Shnaps | |
| 6,786,700 B2 | 9/2004 | Taylor | |
| 6,789,473 B2 | 9/2004 | Eppinger | |
| 7,347,278 B2 | 3/2008 | Lerche | |
| 7,628,137 B1 | 12/2009 | McAlister | |
| 7,784,339 B2 | 8/2010 | Cook et al. | |
| 7,802,457 B2 | 9/2010 | Golovashchenko et al. | |
| 7,802,619 B2 | 9/2010 | Hurst et al. | |
| 7,804,223 B1 * | 9/2010 | Teowee | F42C 9/147 |
| | | | 310/318 |
| 7,848,078 B2 | 12/2010 | Hummel et al. | |
| 7,946,209 B2 | 5/2011 | Schneider et al. | |
| 7,980,309 B2 | 7/2011 | Crawford | |
| 8,213,151 B2 | 7/2012 | Nelson et al. | |
| 8,383,882 B1 | 2/2013 | Piper et al. | |
| 8,487,480 B1 | 7/2013 | Kesler et al. | |
| 8,636,062 B2 | 1/2014 | Fripp et al. | |
| 8,677,920 B1 | 3/2014 | Jeng | |
| 8,907,772 B1 | 12/2014 | Green et al. | |
| 8,978,817 B2 | 3/2015 | Rodgers et al. | |
| 9,091,518 B2 | 7/2015 | Lownds et al. | |
| 9,091,519 B2 | 7/2015 | Lownds et al. | |
| 9,092,108 B2 | 7/2015 | Son et al. | |
| 9,154,532 B2 | 10/2015 | Gutierrez | |
| 9,279,645 B2 | 3/2016 | Schlenter et al. | |
| 9,366,134 B2 | 6/2016 | Walton et al. | |
| 9,390,625 B2 | 7/2016 | Green et al. | |
| 9,447,678 B2 | 9/2016 | Walter et al. | |
| 9,556,725 B2 | 1/2017 | Fripp et al. | |
| 9,562,429 B2 | 2/2017 | Walton et al. | |
| 9,633,165 B1 | 4/2017 | Duncan et al. | |
| 9,671,206 B2 | 6/2017 | Schlenter | |
| 9,711,991 B2 | 7/2017 | Hall et al. | |
| 9,726,009 B2 | 8/2017 | Walton et al. | |
| 9,846,006 B2 | 12/2017 | Beckman | |
| 9,890,620 B2 * | 2/2018 | Maxted | F42C 15/20 |
| 9,909,408 B2 | 3/2018 | Rodgers et al. | |
| 9,926,777 B2 | 3/2018 | Rodgers et al. | |
| 10,043,263 B1 | 8/2018 | Fryshman | |
| 10,089,281 B1 | 10/2018 | Neumann et al. | |
| 10,089,282 B1 | 10/2018 | Neumann et al. | |
| 10,100,635 B2 | 10/2018 | Keller et al. | |
| 10,203,220 B2 | 2/2019 | Koenig et al. | |
| 10,230,243 B2 | 3/2019 | Schatz et al. | |
| 10,267,611 B2 | 4/2019 | Lownds et al. | |
| 10,287,866 B2 | 5/2019 | Angman et al. | |
| 10,295,323 B2 | 5/2019 | Kotsonis et al. | |
| 10,300,800 B2 | 5/2019 | Kurs et al. | |
| 10,310,109 B2 | 6/2019 | Papillon et al. | |
| 10,325,010 B1 | 6/2019 | Neumann et al. | |
| 10,340,745 B2 | 7/2019 | Kurs et al. | |
| 10,429,162 B2 | 10/2019 | Papillon et al. | |
| 10,454,903 B2 | 10/2019 | Neal | |
| 10,508,892 B1 | 12/2019 | Pines et al. | |
| 10,540,425 B2 | 1/2020 | Neumann et al. | |
| 2001/0056544 A1 | 12/2001 | Walker | |
| 2002/0174763 A1 | 11/2002 | Shnaps | |
| 2003/0110970 A1 | 6/2003 | Sansolo | |
| 2003/0135327 A1 | 7/2003 | Levine et al. | |
| 2003/0152145 A1 | 8/2003 | Kawakita | |
| 2003/0192447 A1 | 10/2003 | Meyer et al. | |
| 2004/0049324 A1 | 3/2004 | Walker | |
| 2004/0080411 A1 | 4/2004 | Renfro | |
| 2004/0107027 A1 | 7/2004 | Webb et al. | |
| 2004/0135698 A1 | 7/2004 | Webb et al. | |
| 2004/0233055 A1 | 11/2004 | Canich et al. | |
| 2005/0023409 A1 | 2/2005 | Shnaps et al. | |
| 2005/0178282 A1 * | 8/2005 | Brooks | F42B 3/122 |
| | | | 102/202.7 |
| 2006/0026017 A1 | 2/2006 | Walker | |
| 2006/0043712 A1 | 3/2006 | Hakki et al. | |
| 2006/0055499 A1 | 3/2006 | Bolle | |
| 2006/0206246 A1 | 9/2006 | Walker | |
| 2006/0232052 A1 | 10/2006 | Breed | |
| 2007/0162880 A1 | 7/2007 | Carlson et al. | |
| 2007/0228703 A1 | 10/2007 | Breed | |
| 2007/0299643 A1 | 12/2007 | Guyaguler et al. | |
| 2008/0067792 A1 | 3/2008 | Breed | |
| 2008/0071136 A1 | 3/2008 | Oohashi et al. | |
| 2008/0082237 A1 | 4/2008 | Breed | |
| 2008/0091309 A1 | 4/2008 | Walker | |
| 2008/0134923 A1 | 6/2008 | Lownds | |
| 2008/0156217 A1 | 7/2008 | Stewart et al. | |
| 2008/0222734 A1 | 9/2008 | Redlich et al. | |
| 2008/0243342 A1 | 10/2008 | Breed | |
| 2008/0272580 A1 | 11/2008 | Breed | |
| 2008/0277911 A1 | 11/2008 | Breed | |
| 2008/0284145 A1 | 11/2008 | Breed | |
| 2008/0309060 A1 | 12/2008 | Hakki et al. | |
| 2009/0126691 A1 | 5/2009 | Bach | |
| 2009/0150078 A1 | 6/2009 | Lundgren | |
| 2009/0193992 A1 | 8/2009 | Moore | |
| 2009/0193993 A1 | 8/2009 | Hummel et al. | |
| 2009/0254572 A1 | 10/2009 | Redlich et al. | |
| 2009/0272529 A1 * | 11/2009 | Crawford | E21B 43/1185 |
| | | | 166/250.15 |
| 2009/0306839 A1 | 12/2009 | Youngquist et al. | |
| 2009/0320585 A1 | 12/2009 | Cohen | |
| 2010/0108023 A1 | 5/2010 | McAlister | |
| 2010/0109445 A1 | 5/2010 | Kurs et al. | |
| 2010/0141042 A1 | 6/2010 | Kesler et al. | |
| 2010/0164296 A1 | 7/2010 | Kurs et al. | |
| 2010/0164297 A1 | 7/2010 | Kurs et al. | |
| 2010/0164298 A1 | 7/2010 | Karalis et al. | |
| 2010/0171368 A1 | 7/2010 | Schatz et al. | |
| 2010/0181843 A1 | 7/2010 | Schatz et al. | |
| 2010/0181845 A1 | 7/2010 | Schatz et al. | |
| 2010/0183993 A1 | 7/2010 | McAlister | |
| 2010/0201203 A1 | 8/2010 | Schatz et al. | |
| 2010/0204540 A1 | 8/2010 | Oohashi et al. | |
| 2010/0212527 A1 | 8/2010 | McCaan et al. | |
| 2010/0219694 A1 | 9/2010 | Kurs et al. | |
| 2010/0231340 A1 | 9/2010 | Fiorello et al. | |
| 2010/0237709 A1 | 9/2010 | Hall et al. | |
| 2010/0250497 A1 | 9/2010 | Redlich et al. | |
| 2010/0259108 A1 | 10/2010 | Giler et al. | |
| 2010/0259110 A1 | 10/2010 | Kurs et al. | |
| 2010/0264747 A1 | 10/2010 | Hall et al. | |
| 2010/0277121 A1 | 11/2010 | Hall et al. | |
| 2010/0282057 A1 | 11/2010 | Rapp et al. | |
| 2010/0291816 A1 | 11/2010 | Arvidsson | |
| 2010/0308939 A1 | 12/2010 | Kurs | |
| 2011/0042476 A1 | 2/2011 | McAlister | |
| 2011/0043047 A1 | 2/2011 | Karalis et al. | |
| 2011/0043048 A1 | 2/2011 | Karalis et al. | |
| 2011/0043049 A1 | 2/2011 | Karalis et al. | |
| 2011/0048374 A1 | 3/2011 | McAlister | |
| 2011/0061280 A1 | 3/2011 | Emde et al. | |
| 2011/0083574 A1 | 4/2011 | LeVan et al. | |
| 2011/0095618 A1 | 4/2011 | Schatz et al. | |
| 2011/0263504 A1 | 10/2011 | Cerami et al. | |
| 2011/0265677 A1 | 11/2011 | Hummel et al. | |
| 2011/0283910 A1 | 11/2011 | Moore | |

(56) References Cited

U.S. PATENT DOCUMENTS

| | | | |
|---|---|---|---|
| 2012/0006217 A1* | 1/2012 | Anderson | F42D 3/04 |
| | | | 102/215 |
| 2012/0012019 A1* | 1/2012 | Harding | G04F 10/00 |
| | | | 368/9 |
| 2012/0029765 A1 | 2/2012 | Sheffer et al. | |
| 2012/0042800 A1 | 2/2012 | McCann et al. | |
| 2012/0086284 A1 | 4/2012 | Capanella et al. | |
| 2012/0086867 A1 | 4/2012 | Kesler et al. | |
| 2012/0091794 A1 | 4/2012 | Fiorello et al. | |
| 2012/0091795 A1 | 4/2012 | Fiorello et al. | |
| 2012/0091796 A1 | 4/2012 | Kesler et al. | |
| 2012/0091797 A1 | 4/2012 | Kesler et al. | |
| 2012/0091819 A1 | 4/2012 | Kulikowski et al. | |
| 2012/0091820 A1 | 4/2012 | Campanella et al. | |
| 2012/0091949 A1 | 4/2012 | Campanella et al. | |
| 2012/0091950 A1 | 4/2012 | Campanella et al. | |
| 2012/0095619 A1 | 4/2012 | Pack et al. | |
| 2012/0112531 A1 | 5/2012 | Kesler et al. | |
| 2012/0112532 A1 | 5/2012 | Kesler et al. | |
| 2012/0112534 A1 | 5/2012 | Karalis et al. | |
| 2012/0112535 A1 | 5/2012 | Karalis et al. | |
| 2012/0112536 A1 | 5/2012 | Karalis et al. | |
| 2012/0112538 A1 | 5/2012 | Kesler et al. | |
| 2012/0112691 A1 | 5/2012 | Kurs et al. | |
| 2012/0113575 A1 | 5/2012 | Uy et al. | |
| 2012/0119569 A1 | 5/2012 | Karalis et al. | |
| 2012/0119575 A1 | 5/2012 | Kurs et al. | |
| 2012/0119576 A1 | 5/2012 | Kesler et al. | |
| 2012/0119698 A1 | 5/2012 | Karalis et al. | |
| 2012/0153732 A1 | 6/2012 | Kurs et al. | |
| 2012/0153733 A1 | 6/2012 | Schatz et al. | |
| 2012/0153734 A1 | 6/2012 | Karalis et al. | |
| 2012/0153735 A1 | 6/2012 | Karalis et al. | |
| 2012/0153736 A1 | 6/2012 | Karalis et al. | |
| 2012/0153737 A1 | 6/2012 | Karalis et al. | |
| 2012/0153738 A1 | 6/2012 | Karalis et al. | |
| 2012/0153893 A1 | 7/2012 | Stewart et al. | |
| 2012/0174809 A1 | 7/2012 | Stewart et al. | |
| 2012/0184338 A1 | 7/2012 | Kesler et al. | |
| 2012/0185115 A1 | 7/2012 | Dean | |
| 2012/0223573 A1 | 9/2012 | Schatz et al. | |
| 2012/0228952 A1 | 9/2012 | Hall et al. | |
| 2012/0228953 A1 | 9/2012 | Kesler et al. | |
| 2012/0228954 A1 | 9/2012 | Kesler et al. | |
| 2012/0235501 A1 | 9/2012 | Kesler et al. | |
| 2012/0235502 A1 | 9/2012 | Kesler et al. | |
| 2012/0235503 A1 | 9/2012 | Kesler et al. | |
| 2012/0235504 A1 | 9/2012 | Kesler et al. | |
| 2012/0235505 A1 | 9/2012 | Karalis et al. | |
| 2012/0235566 A1 | 9/2012 | Karalis et al. | |
| 2012/0235567 A1 | 9/2012 | Karalis et al. | |
| 2012/0235633 A1 | 9/2012 | Kesler et al. | |
| 2012/0235634 A1 | 9/2012 | Hall et al. | |
| 2012/0239117 A1 | 9/2012 | Kesler et al. | |
| 2012/0242159 A1 | 9/2012 | Lou et al. | |
| 2012/0242225 A1 | 9/2012 | Karalis et al. | |
| 2012/0248886 A1 | 10/2012 | Kesler et al. | |
| 2012/0248887 A1 | 10/2012 | Kesler et al. | |
| 2012/0248888 A1 | 10/2012 | Kesler et al. | |
| 2012/0248981 A1 | 10/2012 | Karalis et al. | |
| 2012/0256494 A1 | 10/2012 | Kesler et al. | |
| 2012/0280765 A1 | 11/2012 | Kurs et al. | |
| 2012/0299708 A1 | 11/2012 | Guyon et al. | |
| 2012/0313449 A1 | 12/2012 | Kurs et al. | |
| 2012/0313742 A1 | 12/2012 | Kurs et al. | |
| 2013/0014633 A1 | 1/2013 | Diaz | |
| 2013/0057364 A1 | 3/2013 | Kesler et al. | |
| 2013/0085739 A1 | 4/2013 | Booch et al. | |
| 2013/0085740 A1 | 4/2013 | Booch et al. | |
| 2013/0154389 A1 | 7/2013 | Kurs et al. | |
| 2013/0175875 A1 | 7/2013 | Kurs et al. | |
| 2013/0200716 A1 | 8/2013 | Kesler et al. | |
| 2013/0276746 A1 | 10/2013 | McAlister | |
| 2013/0278073 A1 | 10/2013 | Kurs et al. | |
| 2013/0278074 A1 | 10/2013 | Kurs et al. | |
| 2013/0278075 A1 | 10/2013 | Kurs et al. | |
| 2013/0300353 A1 | 11/2013 | Kurs et al. | |
| 2013/0307349 A1 | 11/2013 | Hall et al. | |
| 2013/0334892 A1 | 12/2013 | Hall et al. | |
| 2014/0007756 A1 | 1/2014 | Diaz | |
| 2014/0026775 A1 | 1/2014 | Papillon | |
| 2014/0048037 A1 | 2/2014 | McAlister | |
| 2014/0053750 A1 | 2/2014 | Lownds et al. | |
| 2014/0084703 A1 | 3/2014 | Hall et al. | |
| 2014/0103624 A1 | 4/2014 | Breed | |
| 2014/0159652 A1 | 6/2014 | Hall et al. | |
| 2014/0175898 A1 | 6/2014 | Kurs et al. | |
| 2014/0225449 A1 | 8/2014 | Kurs | |
| 2014/0263697 A1 | 9/2014 | McAlister | |
| 2014/0283597 A1 | 9/2014 | Zheng et al. | |
| 2014/0312706 A1 | 10/2014 | Fiorello et al. | |
| 2014/0312707 A1 | 10/2014 | Fiorello et al. | |
| 2014/0345563 A1 | 11/2014 | McAlister | |
| 2014/0361627 A1 | 12/2014 | Kurs et al. | |
| 2014/0379304 A1 | 12/2014 | Anderson | |
| 2015/0000509 A1* | 1/2015 | Current | E21B 43/11 |
| | | | 89/1.15 |
| 2015/0007740 A1 | 1/2015 | Guyon et al. | |
| 2015/0013560 A1 | 1/2015 | Schlenter et al. | |
| 2015/0069831 A1 | 3/2015 | Kesler et al. | |
| 2015/0119273 A1 | 4/2015 | Goldstein et al. | |
| 2015/0123484 A1 | 5/2015 | Kurs et al. | |
| 2015/0164171 A1 | 6/2015 | Margetis et al. | |
| 2015/0197007 A1 | 7/2015 | Pack et al. | |
| 2015/0219425 A1 | 8/2015 | Beckman | |
| 2015/0220157 A1 | 8/2015 | Marggraff et al. | |
| 2015/0236546 A1 | 8/2015 | Kesler et al. | |
| 2015/0239932 A1 | 8/2015 | Cerami et al. | |
| 2015/0255994 A1 | 9/2015 | Kesler et al. | |
| 2015/0268365 A1 | 9/2015 | Djikpesse et al. | |
| 2015/0270719 A1 | 9/2015 | Kurs et al. | |
| 2015/0347480 A1 | 12/2015 | Smart | |
| 2015/0357831 A1 | 12/2015 | Fiorello et al. | |
| 2015/0361877 A1 | 12/2015 | Gulen | |
| 2016/0003621 A1 | 1/2016 | Koenig et al. | |
| 2016/0028243 A1 | 1/2016 | Schatz et al. | |
| 2016/0043571 A1 | 2/2016 | Kesler et al. | |
| 2016/0087687 A1 | 3/2016 | Kesler et al. | |
| 2016/0108720 A1 | 4/2016 | Teowee et al. | |
| 2016/0120948 A1 | 5/2016 | Basile | |
| 2016/0168199 A1 | 6/2016 | Brines et al. | |
| 2016/0197489 A1 | 7/2016 | Kurs et al. | |
| 2016/0209194 A1 | 7/2016 | Schill, Jr. | |
| 2016/0237794 A1* | 8/2016 | Maxted | F42B 3/182 |
| 2016/0301253 A1 | 10/2016 | Kurs et al. | |
| 2016/0336812 A1 | 11/2016 | Fiorello et al. | |
| 2016/0362015 A1 | 12/2016 | Fiorello et al. | |
| 2017/0002731 A1 | 1/2017 | Wei | |
| 2017/0049177 A1 | 2/2017 | Margetis et al. | |
| 2017/0053736 A9 | 2/2017 | Hall et al. | |
| 2017/0053737 A1 | 2/2017 | Kurs | |
| 2017/0062124 A9 | 3/2017 | Hall et al. | |
| 2017/0123087 A1 | 5/2017 | Papillon et al. | |
| 2017/0133886 A1 | 5/2017 | Kurs et al. | |
| 2017/0153091 A1 | 6/2017 | Diaz | |
| 2017/0205246 A1 | 7/2017 | Koenig et al. | |
| 2017/0232066 A1 | 8/2017 | Cerami et al. | |
| 2017/0251096 A1 | 8/2017 | Koepke | |
| 2017/0263374 A1 | 9/2017 | Schatz et al. | |
| 2017/0286654 A1 | 10/2017 | Nicoll | |
| 2017/0300690 A1 | 10/2017 | Ladnai et al. | |
| 2017/0302685 A1 | 10/2017 | Ladnai et al. | |
| 2017/0328696 A1* | 11/2017 | Muller | F42D 1/05 |
| 2017/0346345 A1 | 11/2017 | Kurs et al. | |
| 2018/0007014 A1 | 1/2018 | Neal | |
| 2018/0045498 A1 | 2/2018 | Teowee et al. | |
| 2018/0058823 A1 | 3/2018 | Diaz | |
| 2018/0099731 A1 | 4/2018 | Beckman | |
| 2018/0122567 A1 | 5/2018 | Hall et al. | |
| 2018/0124080 A1 | 5/2018 | Christodorescu et al. | |
| 2018/0173319 A1 | 6/2018 | Marggraff et al. | |
| 2018/0206579 A1 | 7/2018 | Margetis et al. | |
| 2018/0227320 A1 | 8/2018 | Ladnai et al. | |
| 2018/0268119 A1 | 9/2018 | Nicoll | |

(56) References Cited

U.S. PATENT DOCUMENTS

| | | |
|---|---|---|
| 2018/0276261 A1 | 9/2018 | Smart |
| 2018/0276379 A1 | 9/2018 | Ladnai et al. |
| 2018/0276380 A1 | 9/2018 | Ladnai et al. |
| 2018/0279020 A1 | 9/2018 | Kuiper |
| 2018/0330070 A1 | 11/2018 | Nicoll |
| 2019/0012488 A1 | 1/2019 | Wang et al. |
| 2019/0023392 A1 | 1/2019 | Micros |
| 2019/0049226 A1 | 2/2019 | Liebenberg |
| 2019/0080078 A1 | 3/2019 | Teal |
| 2019/0080102 A1 | 3/2019 | Teal |
| 2019/0081873 A1 | 3/2019 | Kraft |
| 2019/0081928 A1 | 3/2019 | Teal |
| 2019/0081962 A1 | 3/2019 | Teal |
| 2019/0081963 A1 | 3/2019 | Waghorn |
| 2019/0081976 A1 | 3/2019 | Kraft |
| 2019/0081983 A1 | 3/2019 | Teal |
| 2019/0179418 A1 | 6/2019 | Marggraff et al. |
| 2019/0257963 A1 | 8/2019 | Papillon et al. |
| 2019/0258800 A1 | 8/2019 | Ladnai et al. |
| 2019/0265064 A1 | 8/2019 | Koenig et al. |
| 2019/0278760 A1 | 9/2019 | Smart |
| 2019/0346243 A1 | 11/2019 | Fesshaie et al. |
| 2019/0348865 A1 | 11/2019 | Kurs et al. |
| 2019/0368321 A1* | 12/2019 | Eitschberger .......... E21B 23/10 |
| 2020/0014666 A1 | 1/2020 | Neal |
| 2020/0030412 A1 | 1/2020 | Basile |
| 2020/0076837 A1 | 3/2020 | Ladnai et al. |
| 2020/0200516 A1* | 6/2020 | Zemla ..................... F42D 1/045 |

FOREIGN PATENT DOCUMENTS

| | | | |
|---|---|---|---|
| WO | 2005052498 | A1 | 6/2005 |
| WO | 2006050542 | A1 | 5/2006 |
| WO | 2006076777 | A1 | 7/2006 |
| WO | 2006094358 | A1 | 9/2006 |
| WO | 2007124538 | A1 | 11/2007 |
| WO | 2007124539 | A1 | 11/2007 |
| WO | 2008078288 | A1 | 7/2008 |
| WO | 2009143585 | A1 | 12/2009 |
| WO | 010036980 | A1 | 4/2010 |
| WO | 2010085837 | A1 | 8/2010 |
| WO | 2010093997 | A1 | 8/2010 |
| WO | 2011046907 | A2 | 4/2011 |
| WO | 2011095730 | A1 | 8/2011 |
| WO | 2012089854 | A1 | 7/2012 |
| WO | 2013093300 | A1 | 6/2013 |
| WO | 2013127241 | A1 | 9/2013 |
| WO | 2013142840 | A1 | 9/2013 |
| WO | 2015187396 | A2 | 10/2015 |
| WO | 2016183600 | A1 | 5/2016 |
| WO | 2017045022 | A1 | 3/2017 |
| WO | 2018231435 | A1 | 12/2018 |
| WO | 20190145598 | A1 | 8/2019 |
| WO | 2019173601 | A1 | 9/2019 |

OTHER PUBLICATIONS

NTC Thermistor Voltage Divider Temperature, 4 pages.

Volk, Karl R., "Using thermistors in temperature-tracking power supplies", Aug. 2, 2001; EDN, 14 pages.

Hofmann, Heath et al., "Adaptive piezoelectric energy harvesting circuit for wireless remote power supply", Sep. 2022; IEEE Transactions on Power Electronics, vol. 17, No. 5; 9 pages.

European search report, application No. EP 21 76 3931, Jan. 22, 2024.

European search opinion, application No. EP 21 736 3939, Jan. 22, 2024.

* cited by examiner

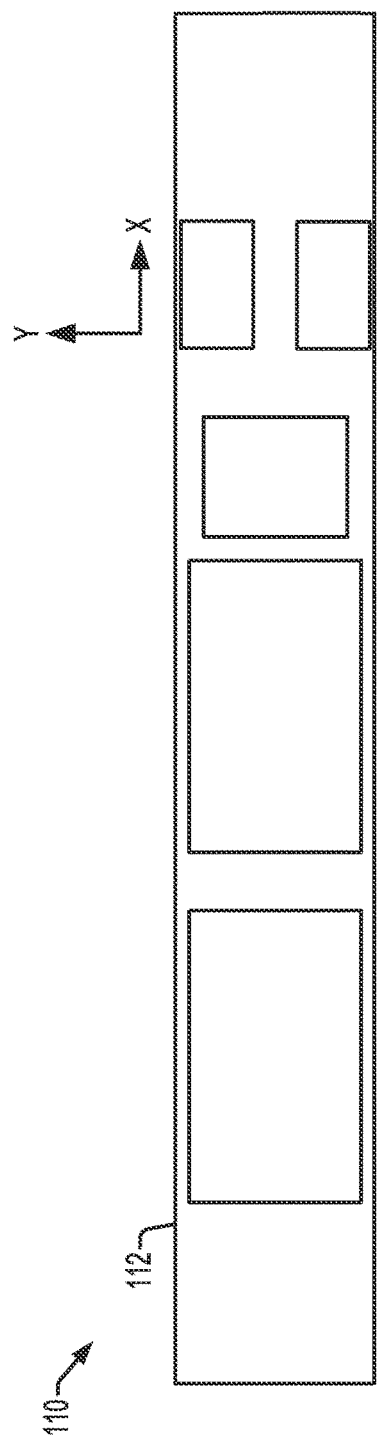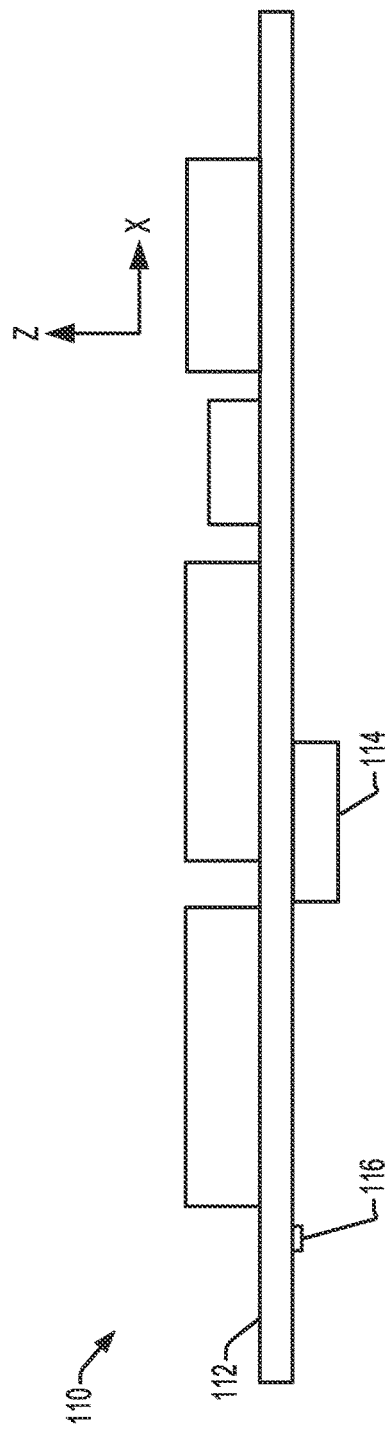

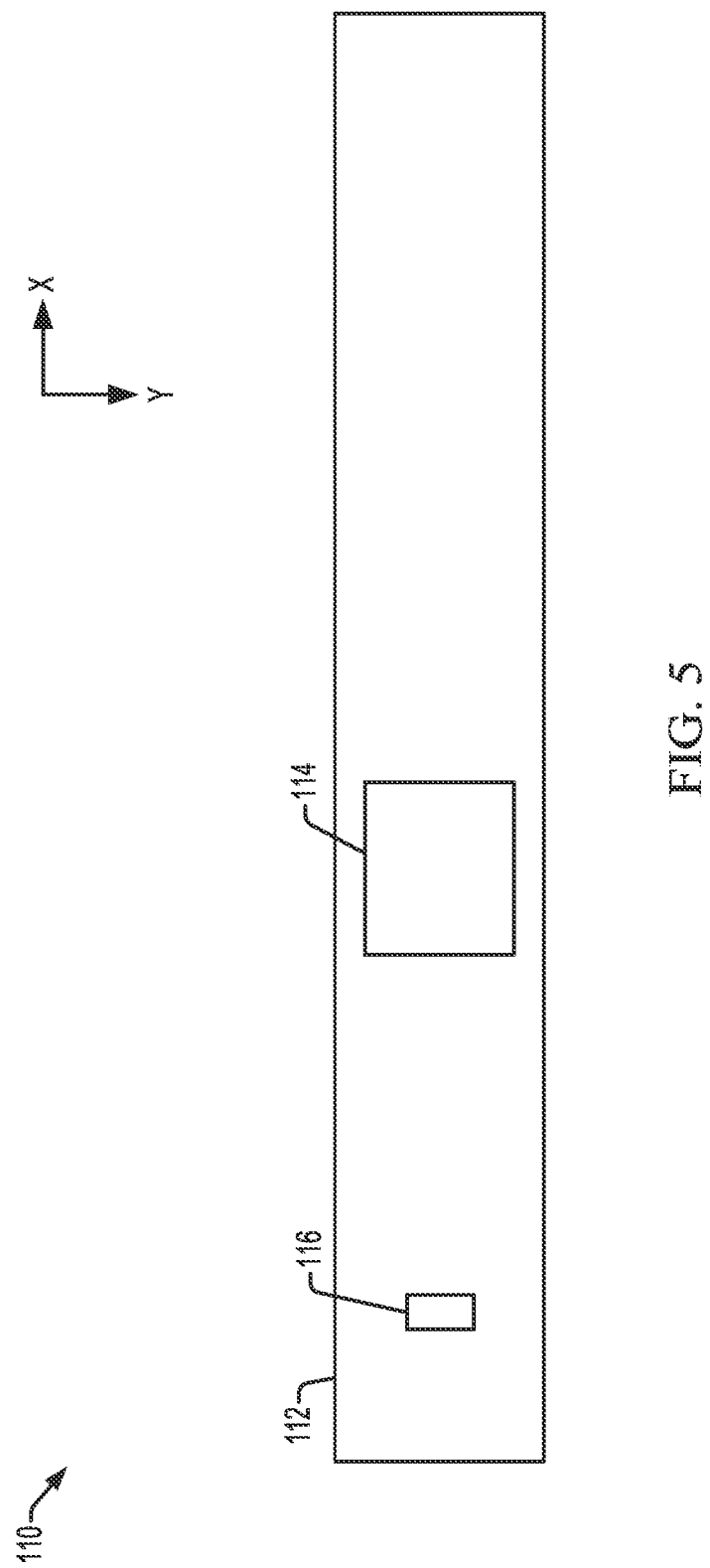

INTEGRATED DETONATOR SENSORS

BACKGROUND

Blasting systems include apparatus to detonate explosive charges positioned in specific locations. Detonators and explosives are buried in the ground, for example, in holes (e.g., bore holes) drilled into rock formations, etc. The detonators are wired for external access to wired or wireless master controllers or blasting machines that provide electrical firing signaling to initiate detonation of the explosives. The blasting machine is wired to an array of detonators, and some blasting systems include a remotely located master controller and a local slave device connected to the blasting machine at the blast site. In wireless blasting systems, no wiring or lead lines are connected between the detonator array and the master controller, and the master controller can be positioned a significant distance from the blast site. A blast sequence may include power up, verification and/or programming of delay times, arming and issuance of a fire command. The blasting machine provides enough energy and voltage to charge firing capacitors in the detonators, and initiates the actual detonator firing in response to the fire command. During the firing phase, upon operator input at the master controller, a fire command is transferred from the master to the slave which then issues the final command to the blasting machine in order to fire the detonators. Sensors are sometimes used, especially temperature sensors, outside the detonators, typically in wireline applications. In wireline applications, a temperature sensor can be inserted outside the detonator and external to perforating guns, sometimes in their own sub or container. Perforating guns are wellbore tools that are lowered own into a wellbore and when at a desired depth or location, the detonator(s) is/are set off to initiate the shaped charges along the sides of the gun to make perforations to allow gas or oil to flow into the wellbore and to the surface. The sub is a unit within a toolstring lowered into the wellbore. However, the measured temperature data from external sensors may not accurately reflect the actual temperature of the detonator.

SUMMARY

Detonators are disclosed with one or more integrated environ mental sensors, and methods are disclosed for measuring environmental parameters in a detonator. A detonator is described, having a substrate, a controller mounted to the substrate, and a sensor coupled to the controller to measure a temperature, pressure, acceleration or other environmental parameter of the detonator. In one example, the substrate is a printed circuit board, and the sensor is mounted to the substrate. The controller in one example stores the measured environmental parameter, transmits the measured environmental parameter from the detonator to a remote master controller, executes an action in response to a value of the measured environmental parameter, and/or prevents or modifies a detonator function in response to the value of the measured environmental parameter.

The detonator in one example includes an enclosure, such as a molded plastic housing, heat shrink tubing, etc. that encloses the controller, the sensor, and a portion of the substrate.

In one example, the integrated sensor has a sensor output coupled to an input of the controller, for example, an input of an analog to digital converter (ADC or A/D) configured to convert a signal from the sensor output. In one example, the sensor is a temperature sensor, such as a thermocouple, RTD, thermistor, etc. In one implementation, the sensor provides a voltage divider having a first resistor with a first terminal coupled to a sensor input of the sensor, and a second terminal coupled to the sensor output, as well as a thermistor having a first terminal coupled to the sensor input, and a second terminal coupled to a reference node. In another example, the sensor is a pressure sensor that includes a piezoelectric component having a first terminal and a second terminal, as well as a bridge rectifier or other diode circuit. In another example, the sensor is an accelerometer.

In another aspect of the present disclosure, a method includes measuring an environmental parameter (temperature, pressure, acceleration) of a detonator using a sensor inside an enclosure of a detonator. The method also includes, using a controller of the detonator, at least one of: transmitting the measured environmental parameter from the detonator to a remote master controller; executing an action in response to a value of the measured environmental parameter; and preventing or modifying at least one detonator function in response to the value of the measured environmental parameter. In one example, the method includes determining whether an environmental profile has been reached based on the multiple samples of the measured environmental parameter, and in response to the environmental profile having been reached, at least one of: executing the action and preventing or modifying the at least one detonator function using the controller.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings.

FIG. 3 is a top plan view of the detonator of FIG. 2.

FIG. 4 is a side elevation view of the detonator of FIGS. 2 and 3.

FIG. 5 is a bottom plan view of the detonator of FIGS. 2-4.

DETAILED DESCRIPTION

Figure 1:
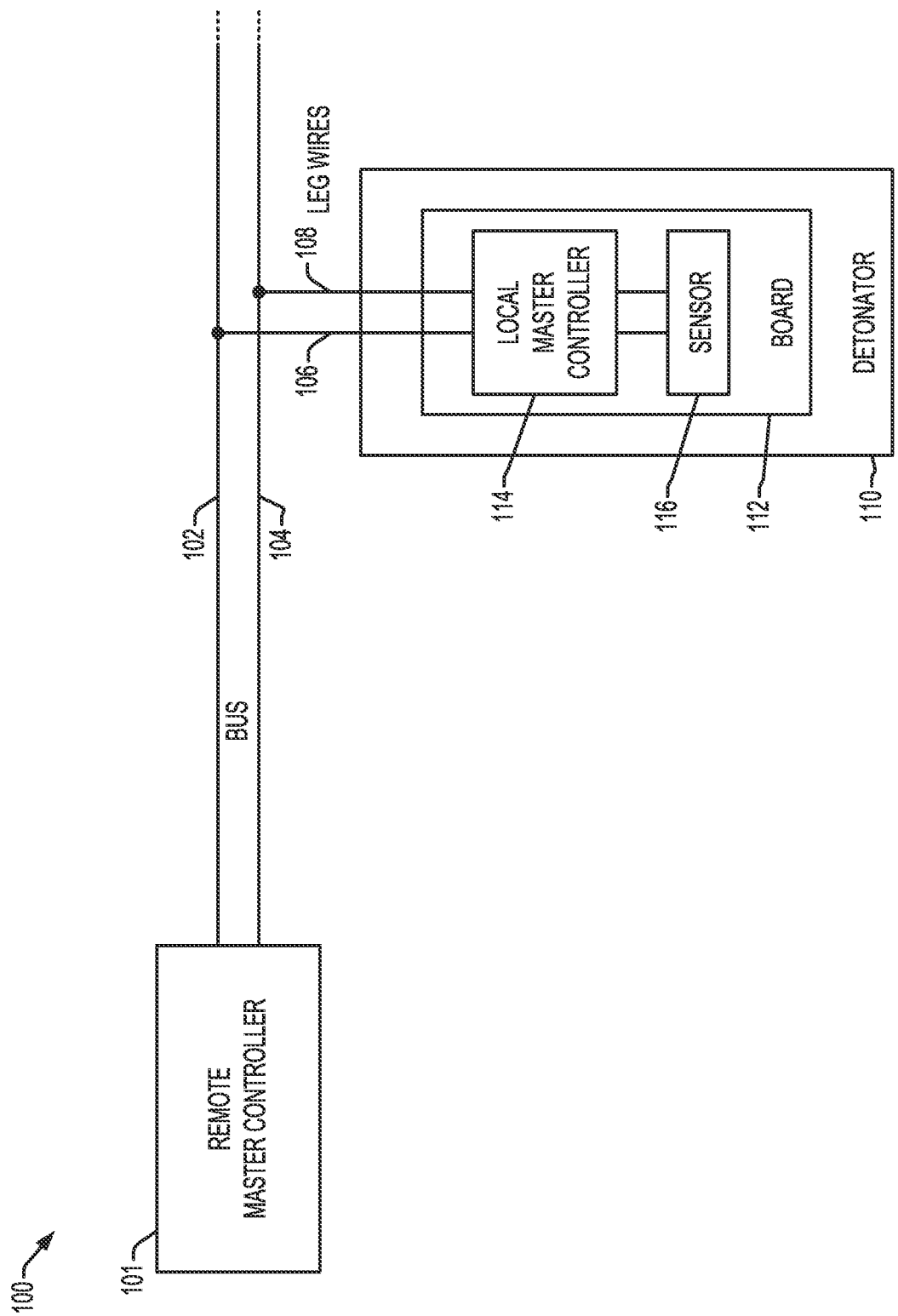
FIG. 1 is a schematic diagram illustrating a detonator with an integrated sensor in a blasting system.
Figure 2:
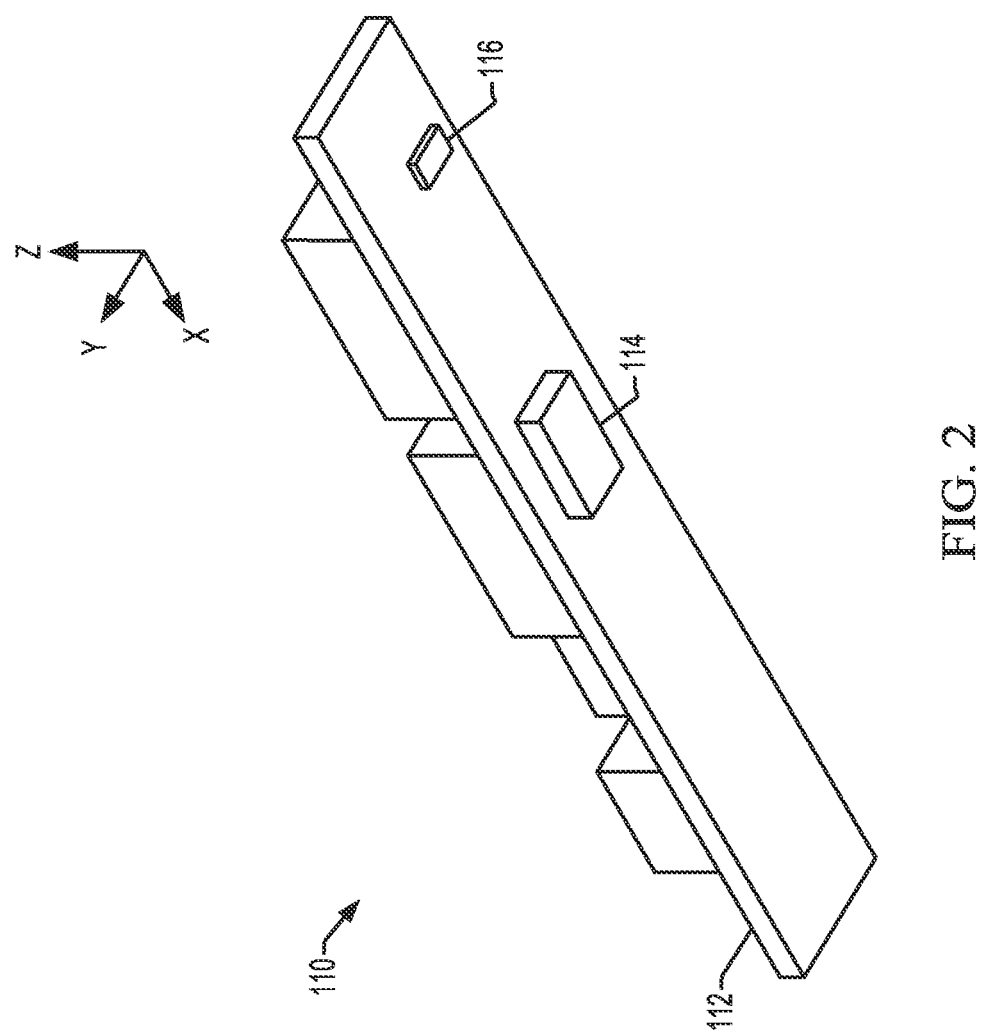
FIG. 2 is a bottom perspective view of a detonator with an integrated sensor mounted on a printed circuit board substrate.

Referring now to the figures, several embodiments or implementations of the present disclosure are hereinafter described in conjunction with the drawings, wherein like reference numerals are used to refer to like elements throughout, and wherein the various features and plots are not necessarily drawn to scale. Measured environmental parameters can indicate environmental impact on pyrotechnics, explosives in a base charge, and/or electronics of the detonator. Environmental detonator history profile data may be useful in identifying safety concerns while retrieving misfired perforating guns to the surface, for example, to know the thermal, pressure, and/or acceleration seen by the detonator while inside a perforating gun. Disclosed detonators and methods advantageously provide integrated detonator sensors and associated environmental parameters measured at or near the detonator to facilitate safety evaluation, and other analysis. As used herein, the terms "couple" or "couples" or "coupled" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a blasting system 100 with an electronic detonator 110 that includes an integrated sensor 116, for example, a temperature sensor, a pressure sensor, an accelerometer, etc. The system 100 includes a remote master controller 101 with connections to a bus having first and second bus wires 102 and 104, respectively. The detonator 110 includes connections to first and second leg wires 106 and 108, respectively coupled to the first and second bus wires 102 and 104. The detonator 110 includes a local master controller 114 coupled to the sensor 116. In one example, the controller 114 is mounted to a substrate, such as a printed circuit board (PCB) 112. In one implementation, the detonator 110 includes more than one sensor 116. In one example, the sensor 116 is mounted to the PCB 112. In another implementation, the sensor 116 is wired to electrical connections of the PCB 112 (e.g., FIG. 14 below). In certain implementations, the detonator 110 includes an enclosure (e.g., FIGS. 10-13 below), and the sensor 116 is positioned at least partially inside the enclosure. The detonator 110 in one example is positioned inside a perforating gun or other outer enclosure (not shown).

Referring also to FIGS. 2-6, one example of the detonator 110 includes various electrical or electronic components mounted to a two-sided PCB 112, including components that form an electronic ignition module (EIM) used in electronic detonators. In this example, the controller 114 is a processor, application-specific IC (ASIC), microcontroller, DSP, FPGA, CPLD, or other integrated circuit or circuits with processing circuitry and electronic memory. In one example, the electronic memory is non-volatile, and the controller 114 is configured to store multiple measured environmental parameters, historical data, and other data associated with the detonator 110. In certain implementations, the controller 114 also includes interface circuitry, such as analog to digital converters, digital-to-analog converters, communication interface circuits, etc. The controller 114 may also include digital interface circuitry, such as data and/or address buses, serial communications circuits, pulse width modulation outputs, etc. For example, the example controller 114 includes serial communications interface circuitry to provide communications with the remote master controller 101 via the bus lines 102, 104 and the leg wire's 106, 108 in FIG. 1.

In the example detonator 110 of FIGS. 2-5, the controller 114 and the sensor 116 are mounted to a bottom side of the PCB 112. The PCB 112 in this example includes input terminals and output terminals (not shown) at opposite ends of the PCB 112 to be coupled to leg wires (e.g., leg wires 106 and 108 in FIG. 1). In addition, the sensor 116 is coupled to the controller 114 (e.g., FIGS. 1 and 6).

Figure 6:
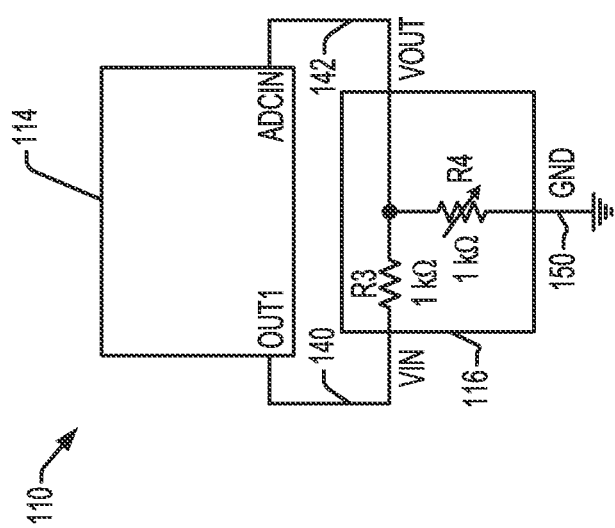
FIG. 6 is a schematic diagram illustrating circuitry in the detonator of FIGS. 2-5.

FIG. 6 shows one example of a temperature sensor 116, such as a Microchip MCP9700 or 9701 connected to an input voltage VIN at an output terminal 140 (OUT1) of the controller 114. In this example, the sensor 116 includes a sensor output 142 coupled to provide a sensor output signal VOUT to an input (ADCIN) of the controller 114. In this example, the sensor 116 includes a resistive voltage divider circuit that provides an analog voltage signal VOUT, and the input of the controller 114 is connected to an internal analog to digital converter (ADC) configured to convert a signal from the sensor output 142. The sensor 116 in this example includes a first resistor R3 having a first terminal coupled to a sensor input 140 of the sensor 116, and a second terminal coupled to the sensor output 142, as well as a negative temperature coefficient (NTC) thermistor R4 having a first terminal coupled to the sensor input 140, and a second terminal coupled to the ground reference node 150. In one example, the resistors R3 and R4 are of generally equal resistances (e.g., 1 kΩ) at a nominal temperature (e.g., 25° C.), and the resistance of the thermistor R4 decreases with increasing detonator temperature. In other implementations, a positive temperature coefficient (PTC) resistive device R4 can be used.

In one example, the detonator 110 includes a thermal (e.g., temperature) sensor 116 as shown in FIGS. 2-6. Other implementations are possible including pressure sensors, accelerometers, or other environmental sensors alone or in combination with one or more temperature sensors. The example of FIGS. 2-6 includes an integrated temperature sensor 116 mounted to the PCB 112. In other implementations, the sensor 116 is not mounted directly to the substrate 112, but is wired to the circuitry of the controller (e.g., FIG. 14 below). The sensor or sensors is/are preferably mounted in somewhat close proximity to the detonator 110, for example, inside or at least partially inside an enclosure (e.g., package or shell) of the detonator 110. The sensor 116 is operatively coupled to the local master controller 114, and to the remote master controller 101 (FIG. 1) to facilitate communication of measured environmental parameters for local processing at the detonator controller 114 and/or at the remote master controller 101. In one example, the local master controller 114 (e.g. microcontroller, ASIC, FPGA, CPLD, etc.) is configured by suitable programming instructions to control the temperature (and/or other environmental) measurements through active command or background operation. The interfacing of sensor 116 to the local master controller 114 and/or to the remote master controller 101 in one example is implemented using serial communications circuitry and protocols such as I2C, SPI, UART, CAN, SMbus, etc. or via an ADC read of the analog output of the sensor 116 (e.g., FIG. 6). In certain implementations, moreover, the local detonator controller 114 implements direct power control to turn on the environmental sensor or sensors 116 on or off to save power consumption. In a normal state the sensor 116 is off, and whenever a temperature or other environmental reading is required according to programming instructions in the detonator 110, the controller 114 applies power to an appropriate input of the sensor 116 (e.g., VIN in FIG. 6). Selective power management, in this regard, can be used with active and/or passive examples of environmental sensors 116 in various implementations.

In one example, the temperature or other environmental readings are initiated by demand from the remote master controller 101 via communications between the controllers 101 and 114 along the bus lines 102, 104 and the leg wires 106, 108. In another implementation, the controller 114 initiates environmental readings continuously in the background at some predetermined regular periods. In one implementation, the local master controller 114 relays readings from the sensor 116 to the remote master controller 101 in response to the readings indicating that one or more environmental parameters (e.g., temperature) has exceeded a predetermined threshold, or in response to the controller 114 determining that multiple readings indicate that a thermal or other environmental profile has been met or exceeded. In this regard, the local master controller 114 in one example is configured by suitable program instructions to perform one or more computations on multiple readings from the sensor 116, for example, to determine environmental levels, environmental level profiles, environmental level rates of change, or other computed values that represent an environmental condition of the detonator 110.

In one implementation, the local master controller 114 can take one or more actions or modify one or more detonator functions in response and/or based on the readings from the sensor 116. In one example, depending on the temperature/pressure/acceleration and/or a range/window of temperature/pressure/acceleration and/or a temperature/pressure/acceleration rise or fall rate, the local master controller 114 is configured to take one or more of the following actions and/or function modification: above a temperature/pressure/acceleration value or values, the detonator 110 will not be able to function; below a temperature/pressure/acceleration value or values, the detonator 110 will be able to function, e.g., an oil well detonator can be fired when a higher temperature/pressure/acceleration (typical of subterranean wellbore condition) is detected to avoid firing at surface; and/or when a thermal/pressure/acceleration profile of the detonator 110 exceeds a predetermined window, the controller 114 transmits a warning signal or error message to the remote master controller 101 to indicate this condition, and appropriate action can be taken by the blaster or operator at the remote master controller 101.

In one example, using an integrated temperature sensor 116, the controller 114 sounds a warning (e.g., via communications to the remote master controller 101) when a critical elevated temperature has been, or almost reached for safety of the electronics or pyrotechnics of the detonator 110. The controller 114 in one example only allows certain functioning, e.g., charging firing capacitors or firing, when a temperature/pressure/acceleration has been reached or when a range of the temperature/pressure/acceleration has been achieved. The controller 114 in one example obtains a thermal history exposure and determines whether any critical thermal profile has been breached to initiate a warning to the remote user at the remote controller 101, for example, during retrieval of the detonator 110. The controller 114 in one example determines whether any functioning of the detonator 110 needs to be modified in view of the elevated temperature, e.g., reduced maximum delay time at higher temperature/pressure/acceleration.

The sensor 116 in one example is a compact, small form factor and footprint to be able to fit into the detonator shell or enclosure. In one example, the sensor 116 is mounted onto a PCB substrate 112 (e.g., FIGS. 2-5) together with other electronic components, and the detonator PCB assembly is inserted into the shell or enclosure after base charge loading. In one example, a temperature sensor 116 is used, such as a passive component, e.g., an NTC (negative temperature coefficient) resistor or thermocouple, or an active sensor 116 can be used, e.g., MCP 9700 Temperature Sensor IC or LM73. Examples of compact accelerometer sensors include ADXL 335, KX003-1077 and LIS2HH12.

Figure 7:
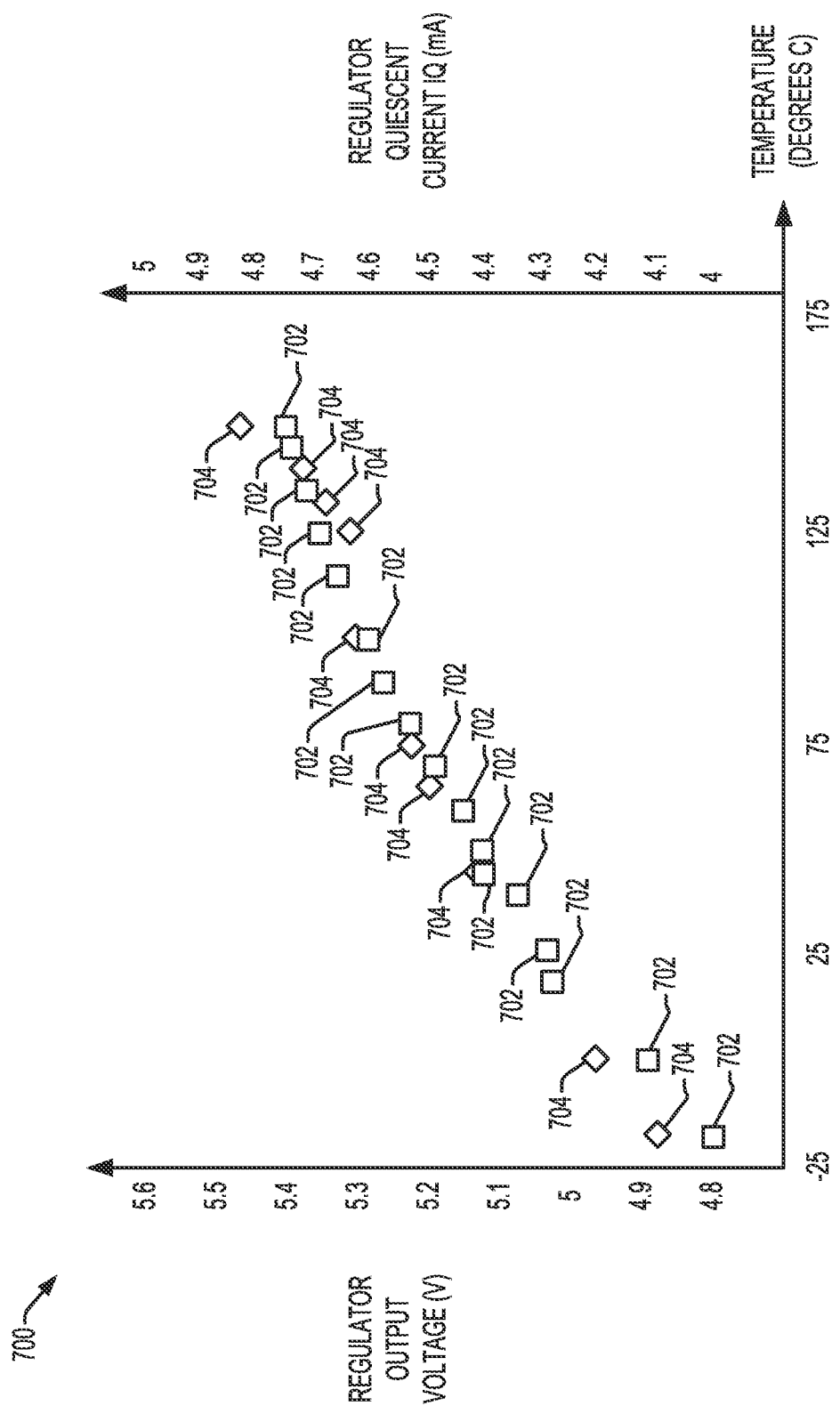
FIG. 7 is a graph of detonator voltage and current as a function of temperature.

Referring also to FIG. 7, in another example, the environmental sensor 116 can be implemented as a thermally sensitive output of another circuit, such as a voltage regulator that tracks well with temperature. FIG. 7 shows a graph 700 of detonator voltage and current as a function of temperature, in this example, including a curve or set of data points 702 showing the output voltage and a curve or set of data points 704 showing the quiescent current of an integrated MCP9700 power supply regulator circuit on the PCB substrate 112 that tracks with the temperature of the detonator 110. The graph 700 and the following table show regulator output voltage values 702 and quiescent current values 704.

regulator output and IQ as function of temperature

| Operating voltage/current VS temperature | | |
|---|---|---|
| T degrees C. | V | mA |
| −17 | 4.8 | 4.1 |
| 1 | 4.89 | 4.21 |
| 19 | 5.025 | |
| 27 | 5.033 | |
| 40 | 5.075 | |
| 45 | 5.10 | 4.42 |
| 50 | 5.124 | |
| 60 | 5.152 | |
| 65 | | 4.5 |
| 70 | 5.192 | |
| 75 | | 4.53 |
| 80 | 5.225 | |
| 90 | 5.263 | 4.63 |
| 100 | 5.281 | 4.63 |
| 115 | 5.327 | |
| 125 | 5.350 | 4.64 |
| 132 | | 4.68 |
| 135 | 5.370 | |
| 140 | | 4.72 |
| 145 | 5.390 | |
| 150 | 5.4 | 4.83 |

In one example, the controller 114 includes an analog to digital converter input coupled to a sensed regulator output voltage or a sensed regulator quiescent current and performs linear interpretation or other curve fitting techniques to derive a corresponding temperature value that is stored and/or reported to the remote master controller 101 as the detonator temperature.

Figure 8:
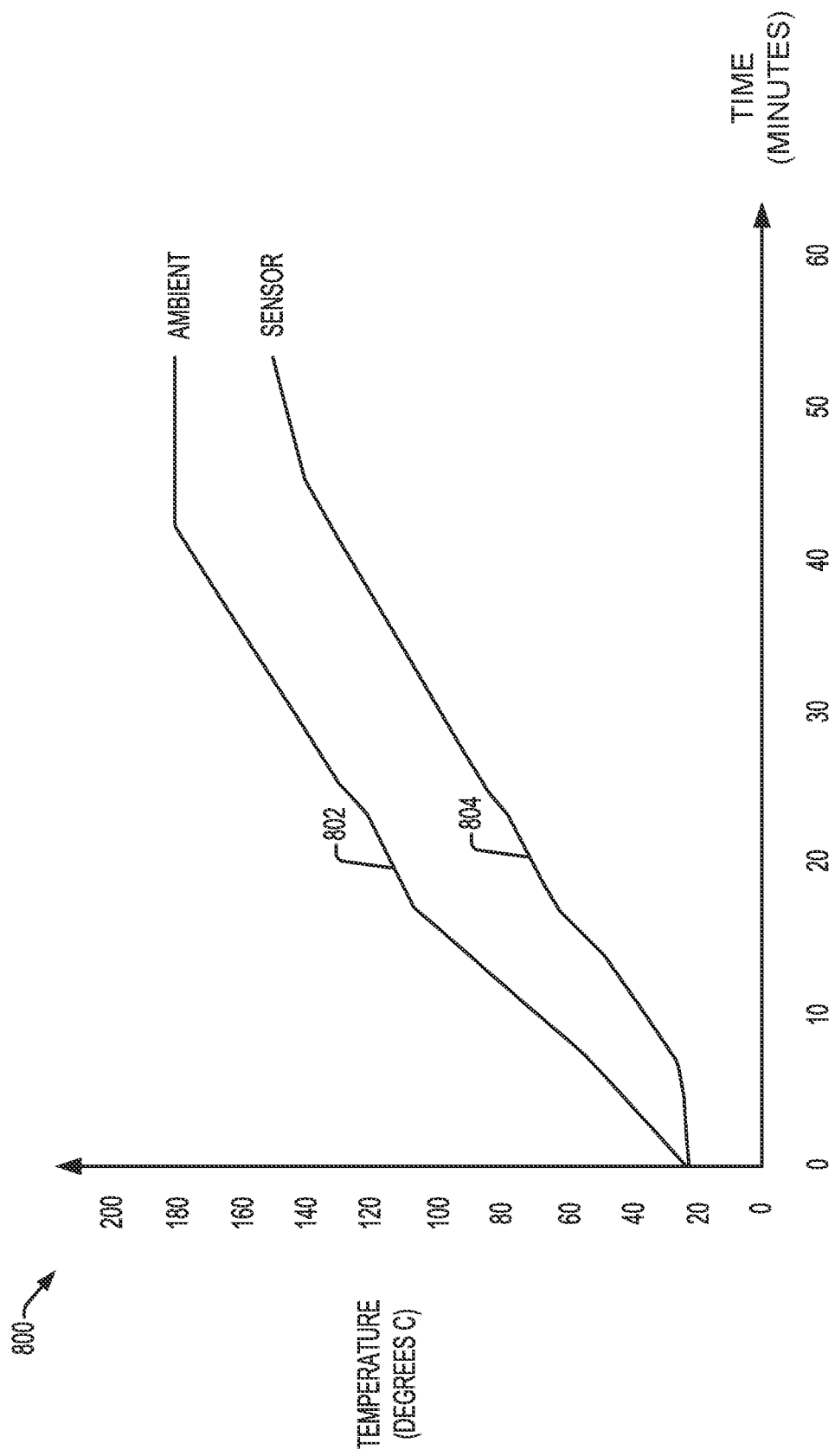
FIG. 8 is a graph of detonator ambient temperature and integrated sensor temperature as a function of time.

FIG. 8 shows a graph 800 that includes a curve 802 showing the ambient detonator temperature, and a curve 804 showing a sensed temperature reading from the integrated temperature sensor 116 (e.g., a Microchip MCP 9700 or 9701 as a function of time. As shown in FIGS. 8, the ambient temperature outside the detonator enclosure can deviate significantly from the detonator temperature itself. The illustrated and described examples include integrated temperature (e.g., and/or pressure and/or acceleration) sensors 116 positioned within the detonator enclosure to provide a more accurate reading of the actual temperature to which the detonator 110 and its electronics and pyrotechnics are exposed.

Figure 9:
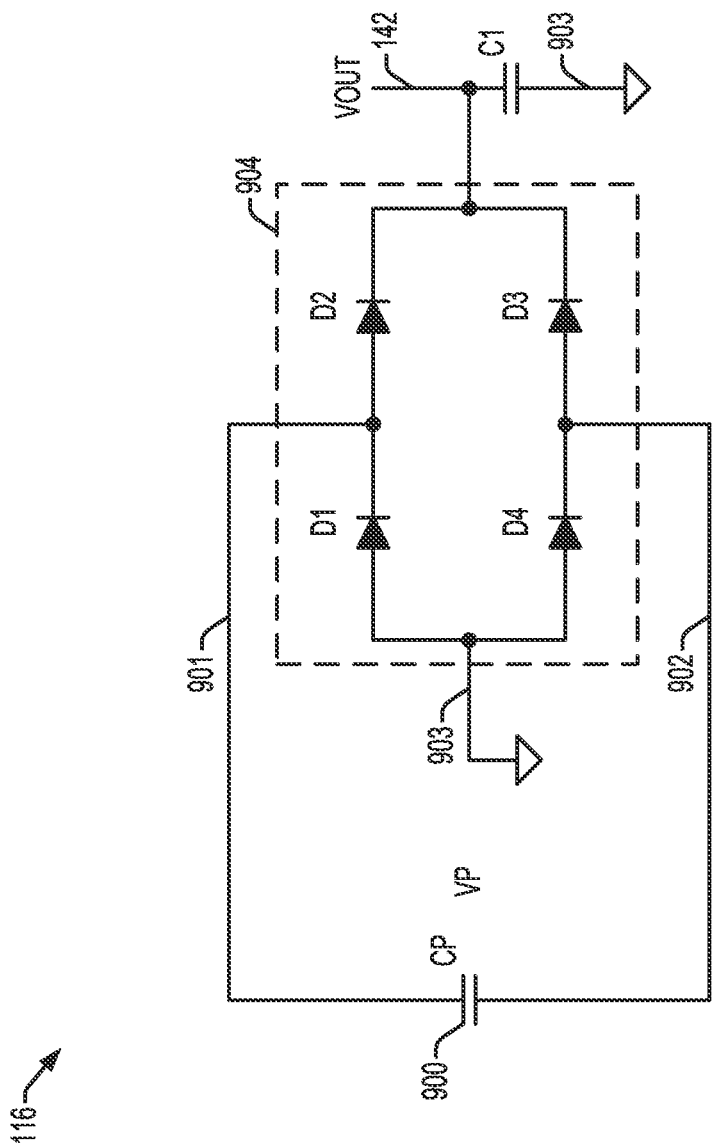
FIG. 9 is a schematic diagram illustrating another example detonator circuit with an integrated piezoelectric capacitor pressure sensor.
Figure 10:
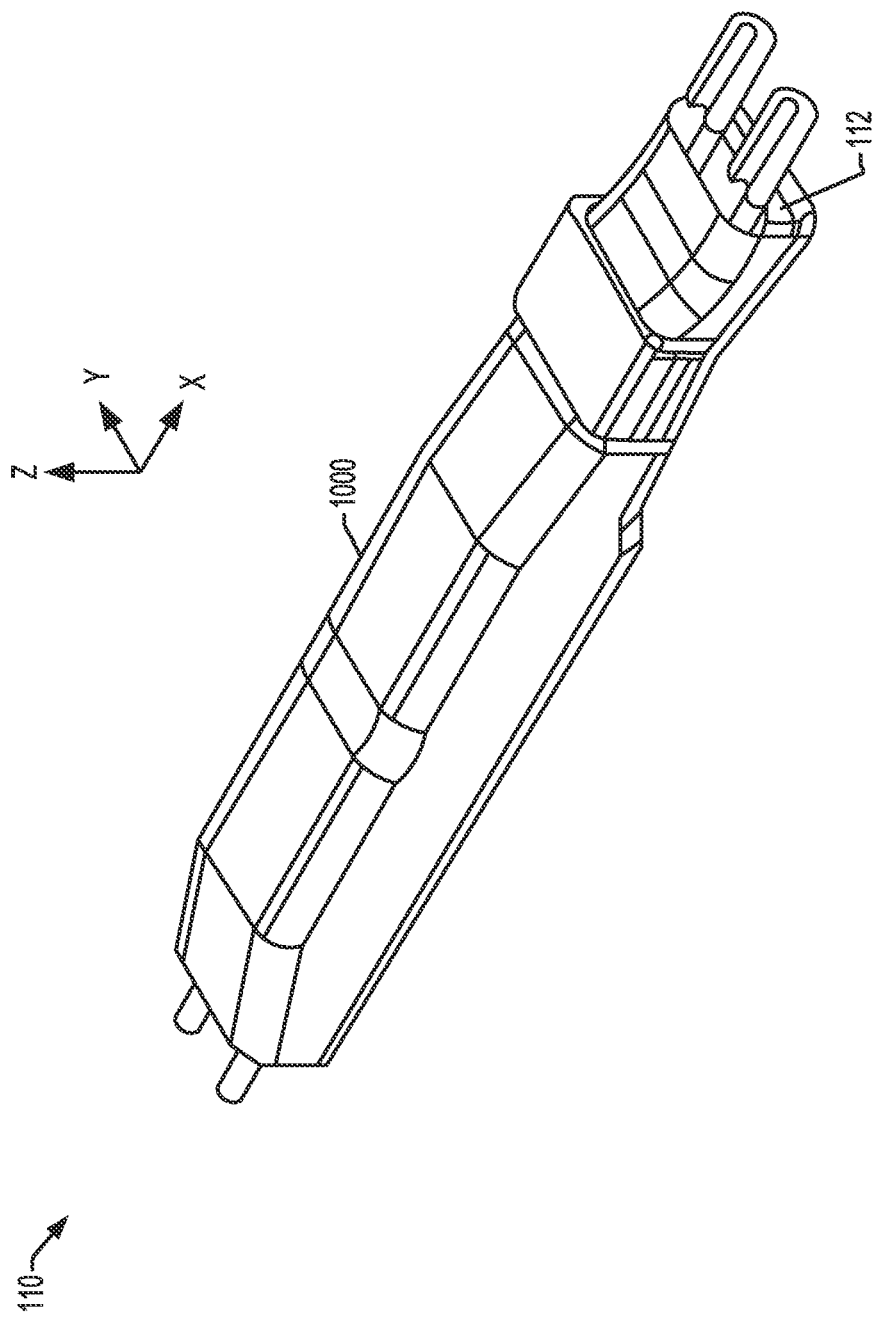
FIG. 10 is a top perspective view of the detonator of FIGS. 2-5 enclosed in a shrink wrap package.
Figure 11:
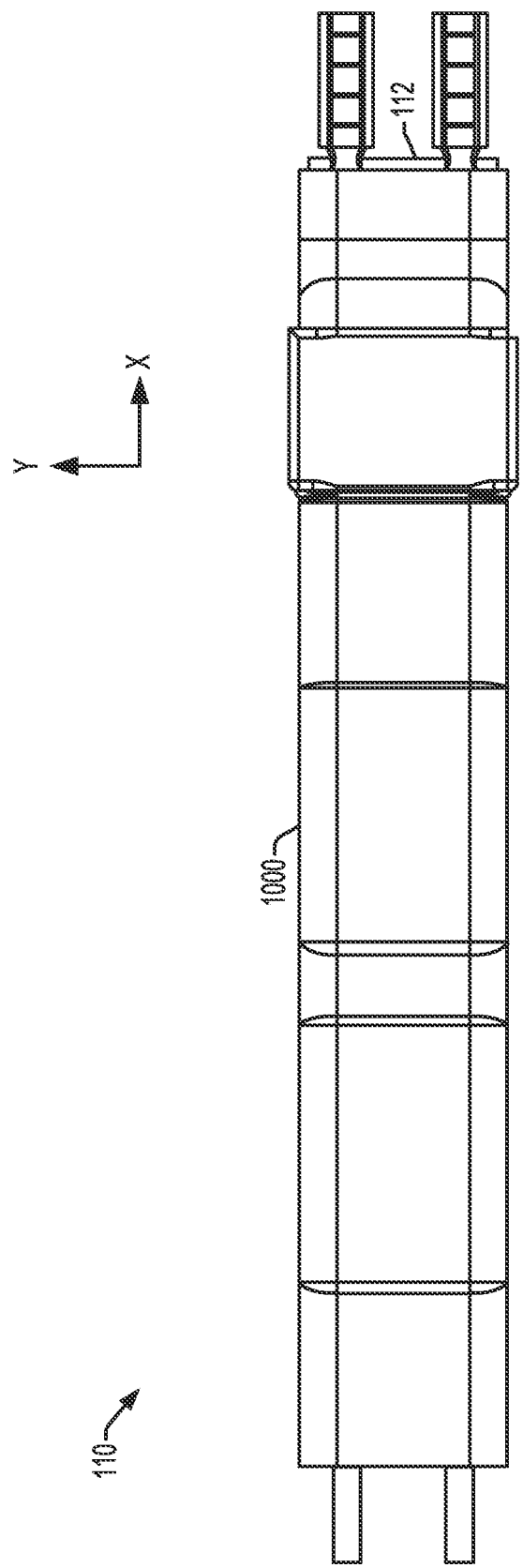
FIG. 11 is a top plan view of the detonator of FIGS. 2-5 and 10.
Figure 12:
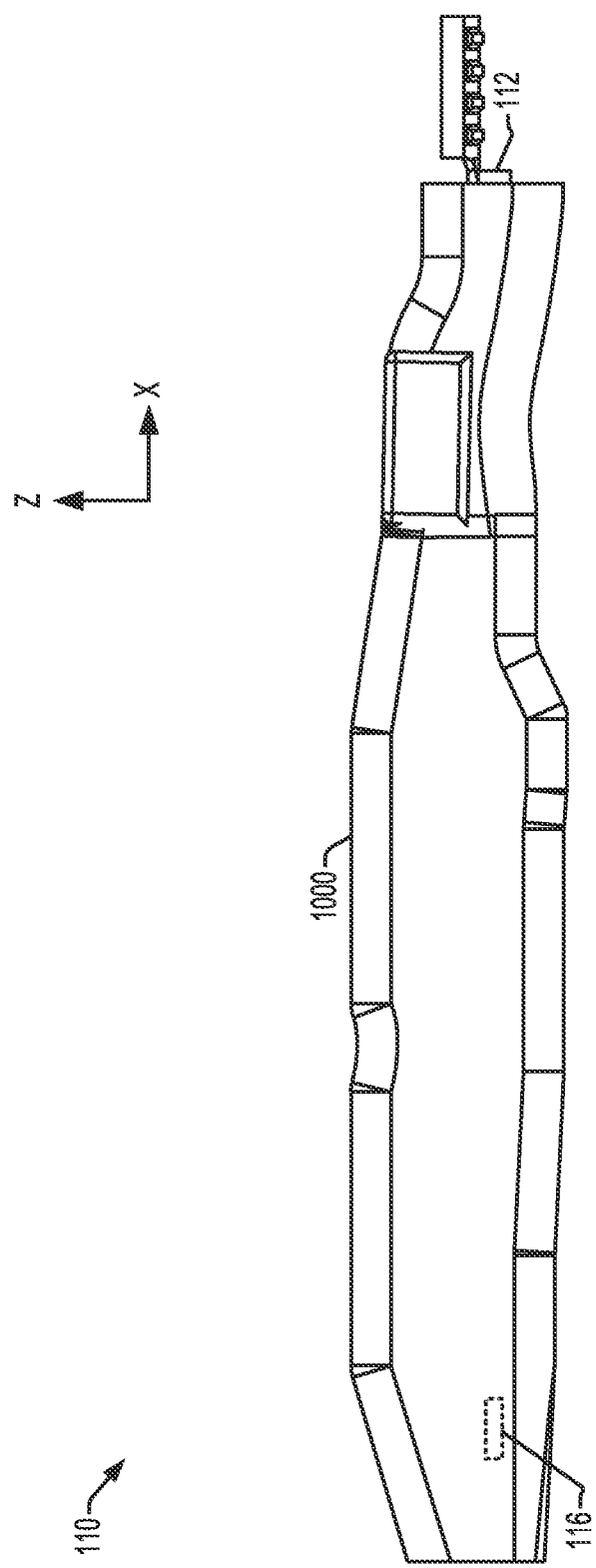
FIG. 12 is a side elevation view of the detonator of FIGS. 2-5, 10 and 11.
Figure 13:
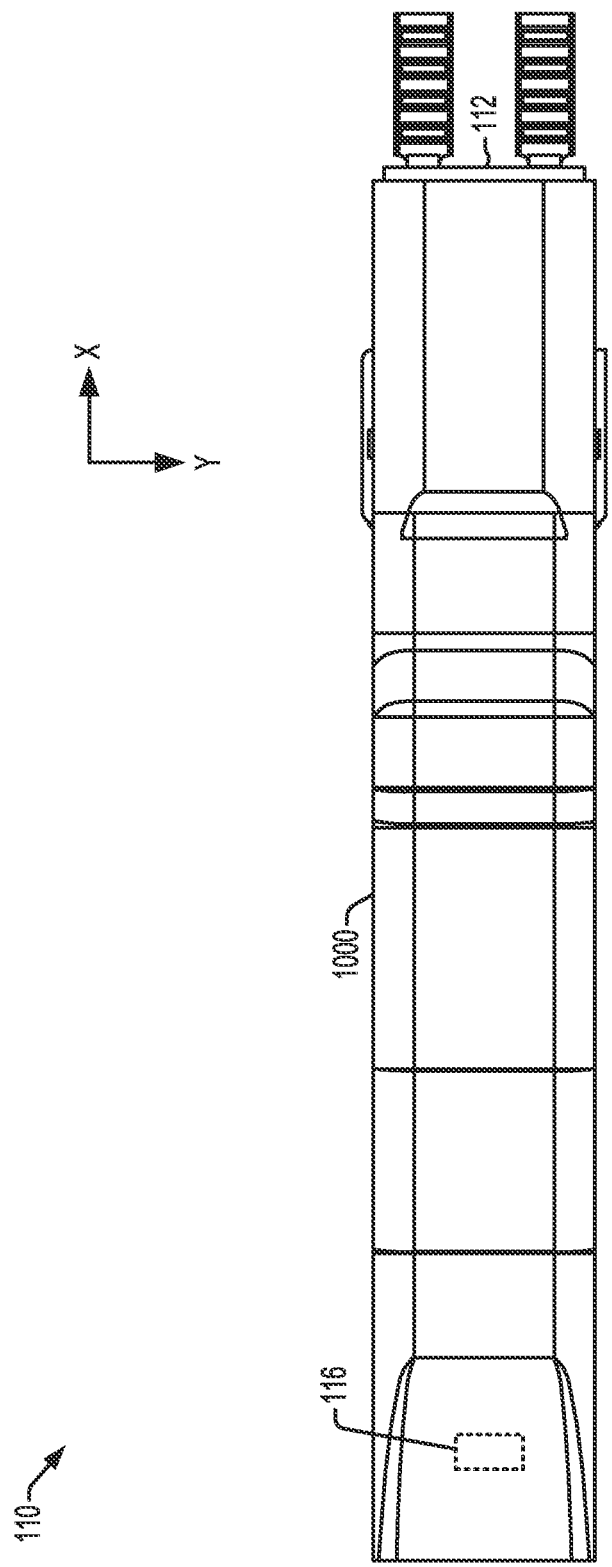
FIG. 13 is a bottom plan view of the detonator of FIGS. 2-5 and 10-12.

Referring also to FIG. 9, in other implementations, the detonator 110 includes an integrated pressure sensor 116, and the controller 114 makes or obtains pressure measurements using the sensor 116, and stores and/or transmits detonator pressure data over the communications lines 102, 104, 106 and 108 to the remote master controller 101. In certain implementations, the controller 114 executes one or more actions in response to pressure data and/or profiles derived or computed from the data, such as determining from pressure sensing prior to the actual programmed delay time that excessive pressure waves may develop before the adjacent detonations, and taking appropriate action, e.g. either shutdown, or fire the detonator immediately to avoid misfire due to such excessive pressure wave damaging the firing electronics of the detonator 110.

FIG. 9 shows another example detonator circuit with an integrated piezoelectric capacitor pressure sensor 116. The sensor 116 in this example includes a piezoelectric component 900, e.g., a capacitor with a nominal capacitance CP and a piezoelectric voltage VP that varies with temperature. The piezoelectric component 900 has a first terminal 901 and a second terminal 902. The pressure sensor 116 in this example also includes a diode rectifier circuit 904 with diodes D1-D4 that rectifies the piezoelectric voltage VP to provide an output voltage signal VOUT that represents the pressure sensed by the piezoelectric capacitor pressure sensor 116. The example diode circuit 904 includes a first diode D1 having an anode coupled to a reference node 903, and a cathode coupled to the sensor input 140, as well as a second diode D2 having an anode coupled to the sensor input 140, and a cathode coupled to the sensor output 142. The diode circuit 904 also includes a third diode D3 having an anode coupled to the second terminal 902 of the piezoelectric component 900, and a cathode coupled to the sensor output 142, and a fourth diode D4 having an anode coupled to the reference node 903, and a cathode coupled to the second terminal 902 of the piezoelectric component 900. An output capacitor C1 is coupled between the reference node 903 and the output node 142 in one example. A simple pressure sensor 116 in this example includes a capacitor containing piezoelectric materials, which can be coupled directly to a bridge rectifier 904 and to the controller 114 which can sense the charge and translate the output voltage VOUT into voltage sensed as a function of the detonator pressure magnitude. The example piezoelectric sensor can be coupled via the bridge rectifier 904 to a storage firing capacitor (not shown) to store additional energy, harvesting the pressure waves transducing into charge to assist in firing the detonator 110. This extra firing energy can increase the max delay time, or be used as extra firing energy during detonator firing for added reliability.

In another implementation, the sensor 116 is an accelerometer. For example, a 3-axis accelerometer sensor (not shown) can be mounted on the PCB substrate 112, with electrical connections accessible to the controller 114, to measure the acceleration (e.g., g's).

Figure 14:
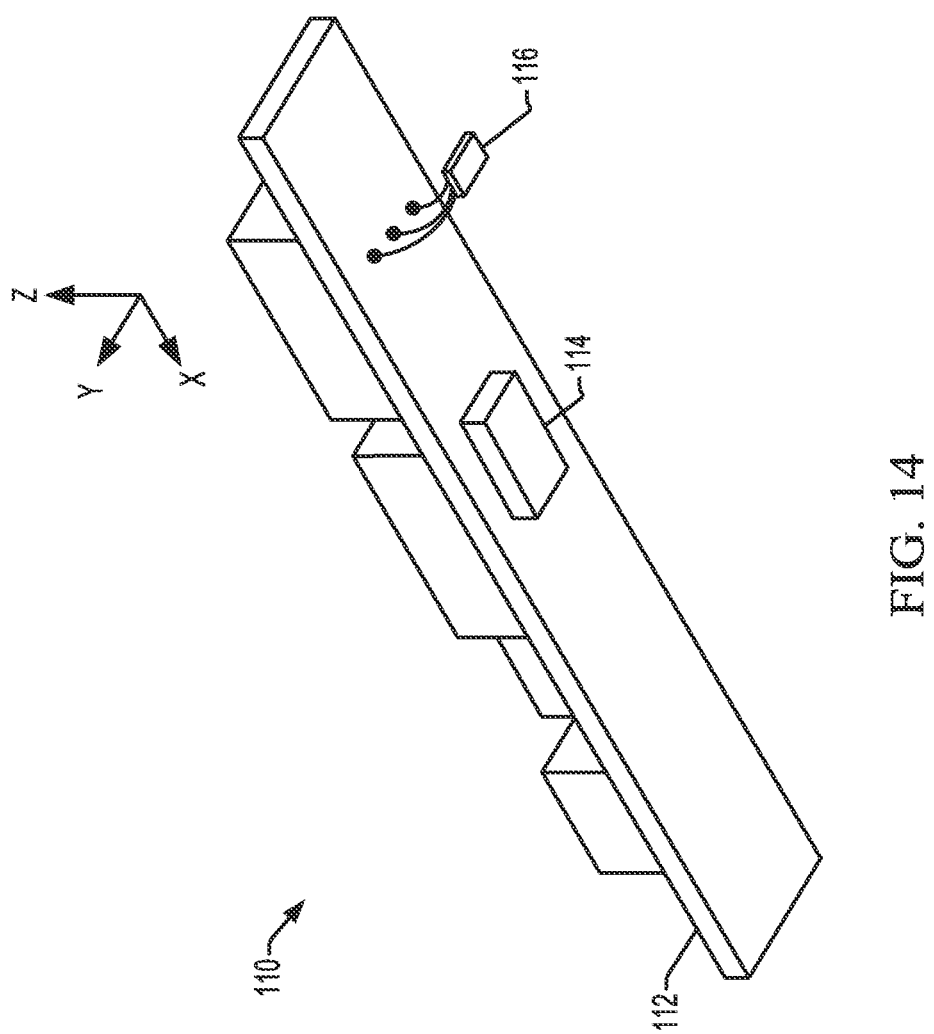
FIG. 14 is a bottom perspective view of another detonator with an integrated sensor wired to a printed circuit board substrate.

Referring also to FIGS. 10-14, FIGS. 10-13 show one implementation of the detonator 110 that includes an enclosure 1000. In certain examples, the enclosure can be a molded plastic shell (e.g., a clamshell design, or other plastic enclosure). In the example of FIGS. 10-13, the enclosure is or includes a heat shrink tubing structure 1000 that encloses the controller 114, the sensor 116, and at least a portion of the substrate 112. As seen in FIGS. 14, moreover, the integrated sensor 116 can be wired to the circuitry of the PCB substrate 112, although not directly mounted to the PCB 112. In certain implementations, a wired environmental sensor 116 is preferably included within the enclosure 1000 (e.g., at least partially inside the heat shrink tubing enclosure 1000 in FIGS. 10-13).

The described integrated sensor implementations provide onboard environmental sensing for an electronic or other type of detonator 110. The onboard accurate temperature reading facilitates intelligent operation of the detonator and the overall blasting system. For example, if a sensor 116 indicates an elevated detonator temperature, either at the high range of specifications or even exceeding the specified operating temperature limits, the system or operators thereof can make judicious decision regarding whether to allow blasting operations such as charging or firing. In one particular example, for a detonator with electronics having a rated operating temperature range of −40° C. to 85° C., if a temperature sensor 116 measures 95° C. in the electronic detonator 110, the local master controller 114 and/or the remote master controller 101 (e.g., or an operator) can then decide whether to allow charging or even firing of the detonator 110 with the currently designated delay times. Current leakage, MOSFET Rdson and voltage regulator output changes with temperature, and the higher temperature may impact reliability of charging or all-fire conditions. Thus, other examples include the controller 114 measuring a voltage regulator output voltage to infer detonator temperature. Measuring the detonator temperature in the presence of elevated temperature environment can help in the reliability of the system. In other implementations, the environmental sensor 116 can be integrated in the controller 114, for example, an internal temperature sensor inside the controller 114. For example, Microchip IC12LF552 or Atmel ATtiny25 contain an internal temperature measurement channel. In certain implementations, the integrated sensor 116 can be used to detect presence of hot holes whereby the mineral sulfides are reacting in exothermic reactions causing temperature rise in boreholes. Such elevated temperature and rise rate in temperature can be used to detect this condition. A background check is done in the background in one example, and the controller 114 raises an alert if the temperature or rise of temperature exceeds a certain limit to transmit to the user when communicating. The transmission of the temp/accelerometer/pressure data from inside the detonator 110 can also be implemented via wireless means, directly to the remote master controller 101 or via intermediary wireless nodes. In addition, the use piezoelectric electric sensors, such as a resistor a capacitor for sensing pressure, allows contemporaneous use of the piezoelectric component for energy harvesting, for example, to facilitate charging firing energy to firing capacitors to enhance firing reliability.

The example embodiments have been described with reference to the preferred embodiments. Modifications and alterations will occur to others upon reading and understanding the preceding detailed description. It is intended that the exemplary embodiment be construed as including all such modifications and alterations insofar as they come within the scope of the appended claims or the equivalents thereof. The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, The following is claimed:

1. A detonator, comprising:
   a substrate;
   a first terminal mounted to the substrate and configured to be coupled to a first leg wire;
   a second terminal mounted to the substrate and configured to be coupled to a second leg wire;
   a controller mounted to the substrate, the controller coupled to the first and second terminals; and
   a sensor coupled to the controller and configured to make multiple readings of a temperature, a pressure, or an acceleration;
   wherein the sensor is inside an enclosure of the detonator;
   wherein the sensor is powered by the controller; and
   wherein the controller is configured to initiate environmental readings of the temperature, pressure, or acceleration in response to a demand from a remote master controller.

2. The detonator of claim 1, wherein the controller is configured to initiate environmental readings of the temperature, pressure, or acceleration continuously in the background at some predetermined regular periods.

3. The detonator of claim 1, wherein the sensor is a temperature sensor.

4. The detonator of claim 3, wherein the sensor includes:
   a first resistor having a first terminal coupled to a sensor input of the sensor, and a second terminal coupled to the sensor output; and
   a thermistor having a first terminal coupled to the sensor input, and a second terminal coupled to a reference node.

5. The detonator of claim 3, wherein the temperature sensor is implemented as a thermally sensitive output of a voltage regulator.

6. The detonator of claim 3, wherein the temperature sensor is configured to detect hot holes where exothermic reactions cause temperature rises in boreholes.

7. The detonator of claim 1, wherein the sensor is a pressure sensor.

8. The detonator of claim 7, wherein the sensor includes:
   a piezoelectric component having a first terminal, and a second terminal; and
   a diode circuit, including:
      a first diode having an anode coupled to a reference node, and a cathode coupled to the sensor input,
      a second diode having an anode coupled to the sensor input, and a cathode coupled to the sensor output,
      a third diode having an anode coupled to the second terminal of the piezoelectric component, and a cathode coupled to the sensor output, and
      a fourth diode having an anode coupled to the reference node, and a cathode coupled to the second terminal of the piezoelectric component.

9. The detonator of claim 1, wherein the sensor is an accelerometer.

10. A detonator, comprising:
    a substrate;
    a first terminal mounted to the substrate and configured to be coupled to a first leg wire;
    a second terminal mounted to the substrate and configured to be coupled to a second leg wire;
    a controller mounted to the substrate, the controller coupled to the first and second terminals; and
    a sensor coupled to the controller and configured to make multiple readings of a temperature, a pressure, or an acceleration;
    wherein the sensor is a pressure sensor that includes: a piezoelectric component having a first terminal, and a second terminal; and a diode circuit, including: a first diode having an anode coupled to a reference node, and a cathode coupled to the sensor input, a second diode having an anode coupled to the sensor input, and a cathode coupled to the sensor output, a third diode having an anode coupled to the second terminal of the piezoelectric component, and a cathode coupled to the sensor output, and a fourth diode having an anode coupled to the reference node, and a cathode coupled to the second terminal of the piezoelectric component; and
    wherein the piezoelectric component is coupled via a bridge rectifier to a storage firing capacitor to store additional energy by harvesting pressure waves transducing into charge to assist in firing the detonator.

11. The detonator of claim 10, wherein the controller is configured to initiate environmental readings of the temperature, pressure, or acceleration continuously in the background at some predetermined regular periods.

12. The detonator of claim 10, wherein the controller is configured to initiate environmental readings of the temperature, pressure, or acceleration in response to a demand from a remote master controller.

13. A method, comprising:
    using a sensor inside an enclosure of a detonator, measuring multiple readings of an environmental parameter including one of a temperature, a pressure, and an acceleration in response to a demand from a remote master controller;
    using a controller of the detonator, at least one of:
       transmitting the measured environmental parameter from the detonator to a remote master controller,
       executing an action in response to a value of the measured environmental parameter, and
       preventing or modifying at least one detonator function in response to the value of the measured environmental parameter.

14. The method of claim 13, further comprising:
    using the sensor and the controller, detecting hot holes where exothermic reactions cause temperature rises in boreholes.

15. The method of claim 13, further comprising:
    using the controller, initiating environmental readings of the temperature, pressure, or acceleration continuously in the background at some predetermined regular periods.

16. A method, comprising:
using a sensor inside an enclosure of a detonator, measuring multiple readings of an environmental parameter including one of a temperature, a pressure, and an acceleration;
using a controller of the detonator, at least one of:
   transmitting the measured environmental parameter from the detonator to a remote master controller,
   executing an action in response to a value of the measured environmental parameter, and
   preventing or modifying at least one detonator function in response to the value of the measured environmental parameter; and
using a piezoelectric component of the sensor, harvesting energy by transducing pressure waves into charge to charge a storage firing capacitor.

17. The method of claim 16, further comprising:
using the sensor and the controller, detecting hot holes where exothermic reactions cause temperature rises in boreholes.

18. The method of claim 16, further comprising:
using the controller, initiating environmental readings of the temperature, pressure, or acceleration continuously in the background at some predetermined regular periods, and initiating environmental readings of the temperature, pressure, or acceleration in response to a demand from a remote master controller.

* * * * *